United States Patent
De Ridder et al.

(10) Patent No.: US 6,746,240 B2
(45) Date of Patent: Jun. 8, 2004

(54) PROCESS TUBE SUPPORT SLEEVE WITH CIRCUMFERENTIAL CHANNELS

(75) Inventors: Christianus Gerardus Maria De Ridder, Hoogland (NL); Theodorus Gerardus Maria Oosterlaken, Oudewater (NL); Frank Huussen, Bilthoven (NL)

(73) Assignee: ASM International N.V., Bilthoven (NL)

( * ) Notice: Subject to any disclaimer, the term of this patent is extended or adjusted under 35 U.S.C. 154(b) by 0 days.

(21) Appl. No.: 10/390,509

(22) Filed: Mar. 13, 2003

(65) Prior Publication Data

US 2003/0175650 A1 Sep. 18, 2003

Related U.S. Application Data

(60) Provisional application No. 60/365,354, filed on Mar. 15, 2002.

(51) Int. Cl.[7] .................................................. F27D 5/00
(52) U.S. Cl. ............................ 432/241; 432/253; 432/5
(58) Field of Search ................................. 432/241, 250, 432/253, 205, 5, 6, 152; 392/416, 418; 219/390; 414/172; 373/128, 130

(56) References Cited

U.S. PATENT DOCUMENTS

| | | | | |
|---|---|---|---|---|
| 5,207,573 A | * | 5/1993 | Miyagi et al. | 432/182 |
| 5,567,149 A | * | 10/1996 | Hansotte et al. | 432/6 |
| 5,662,470 A | * | 9/1997 | Huussen et al. | 432/241 |
| 6,164,963 A | * | 12/2000 | Weaver | 432/241 |

* cited by examiner

Primary Examiner—Gregory Wilson
(74) Attorney, Agent, or Firm—Knobbe, Martens, Olson & Bear, LLP (57) ABSTRACT

A support sleeve for supporting a high temperature process tube comprises one or more circumferential channels, each channel connected to either a feed for gas or a vacuum exhaust. One circumferential channel opens to the top surface of the sleeve, on which the process tube is supported to provide a gas/vacuum seal between the process tube and support sleeve. Another circumferential channel is connected to a gas feed and provided with gas injection holes, evenly distributed along the support sleeve perimeter to provide a cylindrically symmetrical injection of process gas into the process tube. Another circumferential channel is connected to an exhaust for gas and provided with gas exhaust holes, evenly distributed along the circumference of the support sleeve, to provide a cylindrically symmetric exhaust of process gases from the process tube.

58 Claims, 5 Drawing Sheets

PROCESS TUBE SUPPORT SLEEVE WITH CIRCUMFERENTIAL CHANNELS

REFERENCE TO RELATED APPLICATION

This application claims the priority benefit of U.S. Provisional Application Serial No. 60/365,354, filed Mar. 15, 2002.

FIELD OF THE INVENTION

This invention relates generally to furnaces for semiconductor wafer processing and, more particularly, to a process tube support sleeve used in high temperature processing.

BACKGROUND OF THE INVENTION

For a number of reasons, furnaces commonly used for semiconductor processing have shortcomings.

For example, furnaces used in the semiconductor industry for high temperature processing, e.g., processing at temperatures in the range of about 1100° C. to 1350° C., typicallly use process tubes formed of SiC (silicon carbide). Silicon carbide is used to form the process tubes because it desirably is a material that can withstand high temperatures and because it is available in adequate purity for use in semiconductor processing.

A problem encountered with SiC, however, is that it has a high thermal conductivity. Because of this high thermal conductivity, the extremities of a SiC process tube, located away from the heating elements in a furnace, remain very hot even in comparison to parts of the process tube next to those heating elements. Thus, SiC can conduct heat away from the areas near the heating elements, resulting in undesirable heat loss at the extremities of the process tube. To minimize heat loss away from the process tube, U.S. Pat. No. 5,662,470, assigned to ASM International N.V., describes use of a quartz support sleeve, which is less thermally conductive than a similar part made of SiC, between the process tube and a cooler metal support structure.

Where various parts of a furnace meet, a seal is generally required to prevent leakage of process gas out to the ambient environment and leakage of ambient air into the process tube. Because of its high thermal conductivity, the temperature of a SiC process tube at the location of a seal will be close to the operating temperature of the furnace and, so, the seal should be temperature resistant, especially if the furnace: is used for high temperature processing. In U.S. Pat. No. 5,662,470 a seal is formed by simply contacting surfaces of the SiC process tube with surfaces of the quartz support sleeve. Such a seal, however, can still allow some leakage of process gas and ambient air and so, is not adequate for use in cases where a high purity atmosphere inside a process tube is required.

In addition to problems stemming from process tube atmosphere purity requirements, another problem relating to furnaces stems from thermal effects caused by feeding gases into a vertical furnace. Before entering the furnace, a gas should be heated from room temperature to the process temperature. In one design according to the prior art, a gas feed tube is mounted on the outside of the process tube. Gas is supplied, at the bottom of the feed tube, located near the bottom of the process tube, and flowed in an upward direction through the feed tube to the top of the furnace, where it is introduced centrally into the reaction chamber. This scheme causes radial asymmetries in temperature over the length of the process tube because the gas, while flowing through the gas feed tube and up the length of the process tube, heats up by withdrawing heat from the furnace where the gas feed tube is located. In addition, gas introduction at the process tube top results in stronger thermal effects on the uppermost wafers relative to the lower wafers.

Apart from thermal effects caused by a gas feed, the movement of gas feeding into and exhausting out of a process tube can give rise to a flow pattern inside the process tube that is not cylindrically symmetrical, i.e., the flow pattern is not symmetrical over horizontal cross-sections of the process tube. This asymmetrical flow pattern can give rise to non-uniformities in the process results on wafers processed in the process tube.

One possible solution for minimizing these non-uniformities in process results is to rotate, during processing, the boat containing the wafers. By rotating the wafers, local non-uniformities are smeared or averaged out over a complete circle. However, for high temperature applications it is difficult to provide a boat rotation mechanism and rotation feed-through that is sufficiently resistant to the high temperatures (e.g., 1100° C.–1350° C.) employed in such applications.

A further problem with commonly used furnaces is that manufacturing a SiC process tube is costly and complicated, especially when gas feed tubes or gas distribution tubes need to be incorporated into the process tube.

Accordingly, it is an objective of the present invention to provide methods and structures for a furnace that overcome one or more of the disadvantages and difficulties discussed above.

SUMMARY OF THE INVENTION

In accordance with one preferred embodiment of the invention, a support sleeve is provided for supporting a process vessel in a furnace for semiconductor processing. The sleeve comprises a top and a bottom surface and a wall defining the support sleeve. The wall has at least one channel, with surfaces of the wall defining sides of the channel. The channel extends in a horizontal direction along the wall and is connected to a gas communication line.

In accordance with another preferred embodiment, a semiconductor processing furnace is provided. The furnace comprises a process vessel support sleeve having a first surface on which the process vessel is supported, the first surface having a perimeter. The furnace also comprises a process vessel that overlies the support sleeve and has a second surface. The second surface contacts the first surface, which has an opening in that surface. The opening extends along a length of the interface between the first surface and the second surface and the interface extends along the length of the perimeter of the support sleeve.

In accordance with yet another preferred embodiment, a method is provided for forming a seal between parts of a semiconductor processing furnace. The method comprises circulating a gas inside a first sealing channel that is defined by surfaces of a wall. The first sealing channel is open to a first contact surface with a first contact part. The wall defines a support sleeve and partially separates a reaction space for processing wafers and an ambient atmosphere. The support sleeve supports a process tube. The method further comprises generating a first pressure differential, where a first sealing channel gas pressure is either greater than both a reaction space gas pressure and an ambient atmosphere gas pressure or the sealing channel gas pressure is less than both the reaction space gas pressure and the ambient atmosphere gas pressure.

In accordance with yet another preferred embodiment, a method is provided for manufacturing semiconductor devices. The method comprises flowing a gas around an interior of a wall defining a support sleeve that supports a process, around the sleeve's circumference, and expelling the gas out of a surface of the support sleeve.

BRIEF DESCRIPTION OF THE FIGURES

The invention will be better understood from the detailed description of the preferred embodiments and from the appended drawings, which are meant to illustrate and not the invention, and wherein.

DETAILED DESCRIPTION OF THE PREFERRED EMBODIMENTS

The preferred embodiments of the invention overcome many of the disadvantages of conventional furnaces by providing, inter alia, a support sleeve for supporting a semiconductor process vessel and that comprises circumferential channels, i.e., channels extending along a perimeter of the support sleeve and providing a path for gas flow. The channels are preferably connected to gas communication lines that permit gas to be fed into, or exhausted out of, the channels. Advantageously, gas flowing through a circumferential channel at a top surface of the support sleeve can be used to form a gas seal between the support sleeve and an overlying process tube or vessel. In conjunction with, or independent of the gas seal with the overlying process tube, gas flowing through a circumferential channel at a bottom surface of the support sleeve can be used to form a gas seal with a surface underlying the support sleeve. The support sleeve can also comprise gas injection holes for injecting gases into the process tube, the gas injection holes being located along a surface of the support sleeve facing a reaction space delimited by the process tube and preferably feeding gas from a circumferential channel into the reaction space, where semiconductor wafers can be processed. Also provided is a support sleeve having gas exhaust holes opening in the top surface of the sleeve. The gas exhaust holes are connected to a gas exhaust and can serve as an exit for gases inside the furnace.

Typically, a process tube rests by gravity alone on the top surface of the support sleeve, i.e., a structure capable of supporting an overlying process tube along an entire bottom perimeter of the process tube. Commonly, grinding and polishing of the contact surfaces of the process tube and of the support sleeve smoothes those surfaces, minimizing gaps at the interface between those surfaces and providing resistance against diffusion of gases between the inside of the process tube and the ambient atmosphere. In such a way, a reasonable seal can be achieved. Such seals are common in conventional prior art support sleeves.

For critical applications, however, this seal is not adequate, since some gas leakage can still occur. Furthermore, the quality of the seal is critically dependent upon the flatness and surface roughness of the contact surfaces. Any variations in the flatness and/or roughness of the contact surfaces will result in variations in the quality of the seal. Desirably, preferred embodiments of the invention preferably provide a superior seal.

According to one preferred embodiment, a circumferential channel is provided adjacent to and opening up along a top surface of a support sleeve. When used in a furnace for semiconductor processing, a process tube preferably overlies and is supported by the support sleeve. Preferably the process tube rests by gravity alone on top of the support sleeve, although in other arrangements, mechanical means known in the art can be used to increase the contact pressure between the support sleeve and the process tube. Advantageously, with an opening at the support sleeve's top surface, the circumferential channel can act as a sealing circumferential channel, providing a gas seal between the process tube and the support sleeve.

It will be appreciated that the gas seal is a seal created by flowing gas across the interface between the contacting surfaces of the process tube and the support sleeve, with the gas flowing out of or into the support sleeve. For example, in one embodiment, the sealing circumferential channel is connected to a gas communication line which is a gas feed, preferably an inert gas feed, which in turn is connected to a pressurized gas source, preferably, a pressurized inert gas source. The sealing circumferential channel is open to the top surface of the support sleeve. Preferably, the opening is a single continuous opening that extends the entire perimeter of the top surface. In another embodiment, the opening comprises a plurality of openings extending along the perimeter of the top surface, with each of the openings preferably separated by a distance no greater than the thickness of the support sleeve wall. By feeding inert gas from the pressurized inert gas source into the sealing circumferential channel, the pressure of the inert gas inside the sealing circumferential channel can be made greater than both the pressure of gases inside the process tube and the pressure of gases outside the process tube, in the ambient environment. Thus, neither the pressure of gases in the reaction space, nor the pressure of gases in the ambient environment, is greater than the pressure of the gas in the sealing circumferential channel. As a result, inert gas can be made to flow out of the sealing circumferential channel and leak away in one direction into the reaction space delimited by the process tube and in the other direction into the ambient atmosphere. In this way, the inert gas and its leakage constitutes a gas seal, with the gas leaking out from the seal substantially preventing gases in the reaction space from leaking into and through the seal and out of the seal into the ambient atmosphere, or vice versa.

Advantageously, providing a gas seal makes the quality of the seal more constant and reliable, and less dependent upon the flatness and roughness of the contact surfaces. Another advantage of a gas seal is that it is as resistant to high temperatures as the simple mechanical (gravitational) seal resulting from contacting surfaces, but more effective in sealing, given its reduced dependence upon contact surface flatness and roughness. Also, while inert gases generally, or mixtures of these gases, can be used for inert gas seals, suitable inert gases can conveniently include commonly used inert gases i'such as nitrogen (N$_2$) or argon (Ar).

According to another preferred embodiment, an additional sealing circumferential channel is provided adjacent to a bottom surface of the support sleeve, the sealing circumferential channel being open to the bottom surface over the bottom surface's entire length. As with the opening for the top surface sealing circumferential channel, preferably, the opening for the bottom surface sealing circumferential channel is a single continuous opening that extends the entire perimeter of the bottom surface. In another embodiment, the bottom surface sealing circumferential channel comprises a plurality of openings extending along the perimeter of the bottom surface, each opening preferably separated by a distance no greater than the thickness of the support sleeve wall. In addition, the bottom surface of the support sleeve preferably constitutes part of a removable closure, i.e., in a closed position the bottom surface preferably mates with a structure that is removable from the furnace and forms a seal with the support sleeve. For example, the support sleeve preferably remains stationary, supporting the process tube and, as discussed below regarding the illustrated embodiment, the removable closure is part of a pedestal, which supports a wafer boat and can be removed from the furnace. Upon being inserted into the furnace, the pedestal contacts the support sleeve, forming a mechanical seal with the support sleeve and acting as a closure.

The bottom surface sealing circumferential channel is preferably connected to an inert gas feed which in turn is connected to a pressurized source for inert gas. It will be appreciated that the pressurized inert gas source can be the same as that used for the sealing circumferential channel at the top surface of the support sleeve, although separate inert gas feeds and separate gas sources can be used for each channel. In this way, the additional sealing circumferential channel advantageously provides an inert gas seal at the bottom of the support sleeve, the gas seal being similar to the gas seal between the support sleeve and the process tube at the top of the support sleeve.

Thus, advantageously, the support sleeve preferably forms gas seals with overlying and underlying structures at contact interfaces with various overlying and underlying surfaces. Preferably, these interfaces include the points of contact between four surfaces. For example, the bottom of a process vessel includes a first surface which contacts a second surface, the top surface of the support sleeve. A removable closure underlying the support sleeve includes a third surface which contacts a fourth surface, the bottom surface of the support sleeve. In the illustrated embodiment, gas seals are formed between the first and second surfaces and between the third and the fourth surfaces; the skilled artisan will readily appreciate, however, that a gas seal need not be formed at both interfaces, i.e., the seal can be formed at one or the other interface.

According to another preferred embodiment, one or both of the sealing circumferential channels can be connected to a gas communication line that is a gas exhaust. The exhaust is connected to an apparatus that generates a vacuum, e.g., a vacuum pump that is used to evacuate gas from the channel. In this embodiment, the pressure of the gas inside the sealing circumferential channel is less than either the pressure of gases inside the process tube or the pressure of gases outside the process tube, in the ambient environment. Consequently, a gas seal is formed by a low pressure sealing channel so that gas, from inside the process tube and from the outside ambient atmosphere, is being drawn into the sealing circumferential channel and removed by the vacuum pump via the exhaust.

An advantage of this embodiment is that process gases inside the process tube are not diluted with inert gas, as may occur when pressurized inert gas from a gas seal leaks into the process chamber. Such dilution may undesirably influence process results on wafers in the vicinity of the gas seal. As such, use of a vacuum, rather that pressurized inert gas, can reduce process variations caused by dilution of process gas. Also, this embodiment has the advantage of further securing the process tube to the support sleeve; that is, the process tube is kept in place on the support sleeve not only by gravitational forces, i.e., due to the process tube's own weight, but also by forces exerted by the vacuum.

According to another preferred embodiment, a circumferential channel of the support sleeve is connected to a source of process gas and is also provided with a plurality of gas injection holes, distributed in a spaced-apart relationship along the length of the circumferential channel. In this way, the circumferential channel acts as a gas distribution circumferential channel. The gas injection holes open to the reaction space and allow process gases to be discharged out of the gas distribution circumferential channel into that volume. Preferably, the gas injection holes provide the sole entry point for transporting gases into the reaction space. In addition, the gas injection holes are preferably equally spaced apart over the length of the gas distribution circumferential channel. The cross sectional area of each gas injection hole is preferably small in comparison to the cross sectional area of the gas distribution circumferential channel, so that the flow of gas through each of the gas injection holes is approximately equal. As a result of the roughly equal flow of gases out of the gas injection holes and the roughly equal spacing of those holes from each other, a cylindrically symmetrical injection of process gas into the process tube is desirably achieved.

In accordance with yet another preferred embodiment, the support sleeve is provided with a circumferential channel that is connected to a gas exhaust and, so, acts as a gas exhaust circumferential channel. The gas exhaust circumferential channel is provided with a plurality of exhaust holes distributed in a spaced-apart relationship along the length of the gas exhaust circumferential channel. Preferably, the gas exhaust holes are equally spaced apart over the length of the gas exhaust circumferential channel. In addition, the cross-sectional area of each gas exhaust hole is preferably small in comparison to the cross-sectional area of the exhaust channel, so that the flow of gas through each of the gas exhaust holes is approximately equal and a cylindrically symmetrical exhaust of gas is achieved.

Reference will now be made to the Figures, wherein like numerals refer to like parts throughout.

Figure 1:
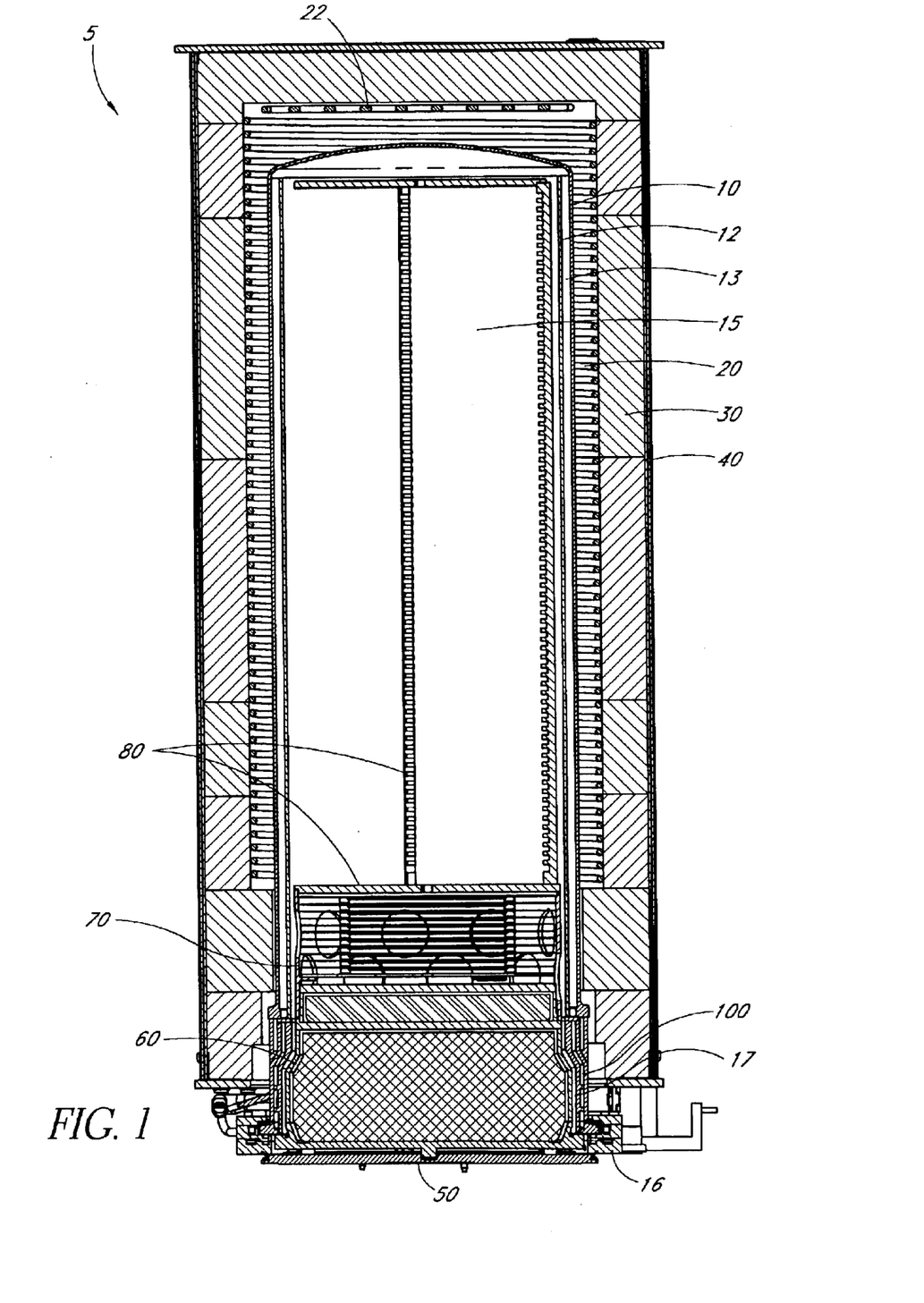
FIG. 1 is a cross-sectional side view of a furnace provided with a support sleeve according to a preferred embodiment of the invention.
Figure 2:
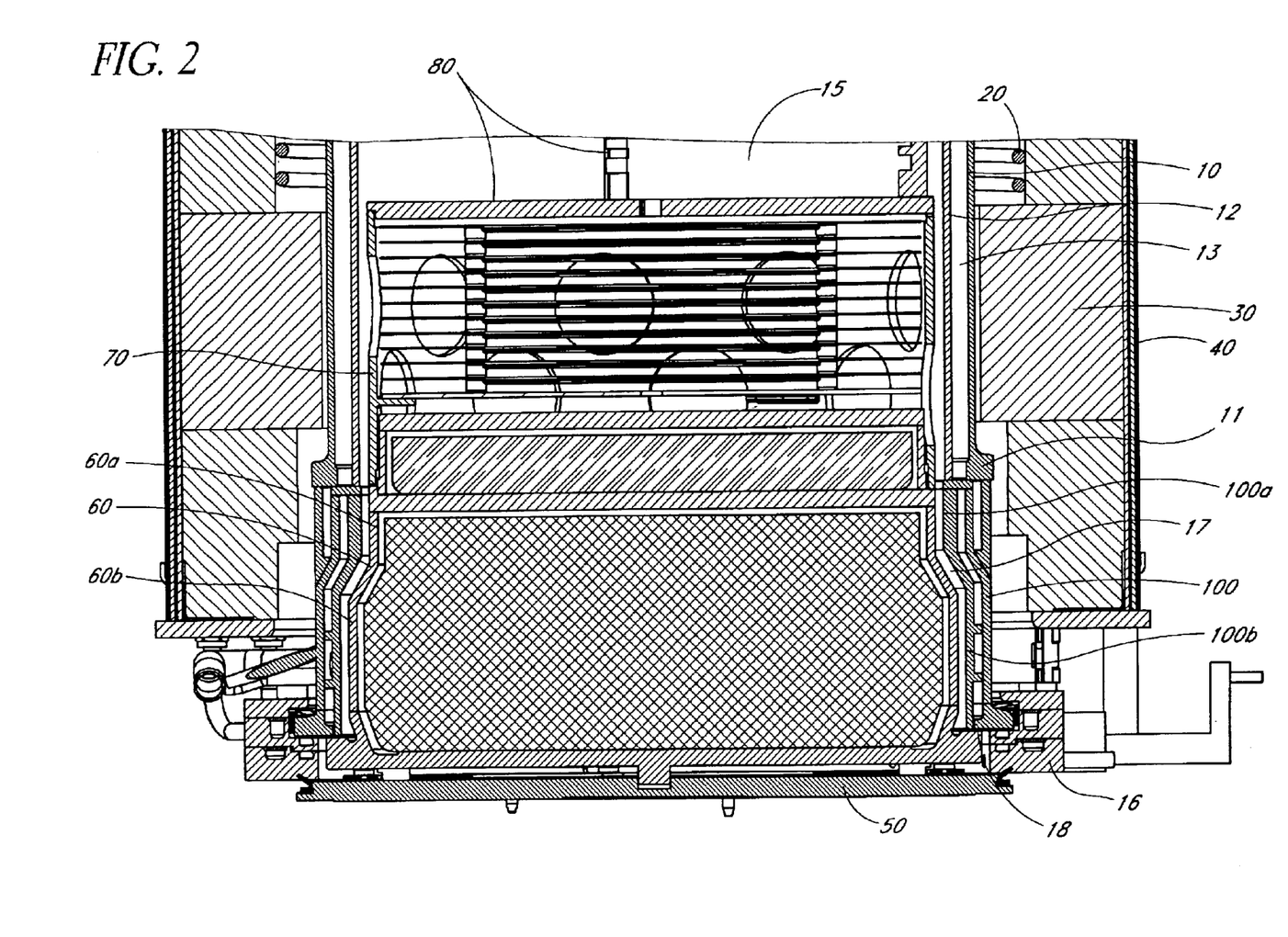
FIG. 2 is an enlargement of the lower section of FIG. 1.

FIG. 1 shows a furnace 5, provided with a support sleeve 100 according to preferred embodiments of the invention. FIG. 2 shows the lower section of the furnace 5 in greater detail. With reference to both FIGS. 1 and 2, an outer process tube or vessel 10 and an inner tube or vessel 12 are both supported by a support sleeve 100, which in turn is supported by flanges 16. The support sleeve also contacts a flange 18, shown as part of the pedestal 60. The cylindrical process tube 10 terminates at a lower end at a flange 11 and is surrounded by a cylindrical heating coil 20, a top heating coil 22, insulation material 30 and an outer shell 40. A doorplate 50 supports a pedestal 60, a support cylinder 70 and a wafer boat 80. The process area, or reaction space, 15, in which process gases can interact with wafers (not shown)

during semiconductor fabrication processes, is delimited by the inner tube 12 (which is open at its bottom and top ends and is inside the outer process tube 10), the outer process tube 10, the support sleeve 100 and the pedestal 60. Inside the inner tube 12, process gas moves in an upward direction. The gas is exhausted from the top of the furnace in a downward direction through the annular gap 13 between the inner tube 12 and the outer process tube 10.

Advantageously, in the illustrated embodiment, as described in greater detail below, the support sleeve 100 forms gas seals with the overlying process vessel 10 and the underlying pedestal flange 18 at the interfaces between various contact surfaces of those structures. As illustrated, the bottom of the flange 11 constitutes a first surface which is illustrated contacting a second surface, which is the top surface of the support sleeve 100. The flange 18 constitutes a third surface which contacts a fourth surface, which is the bottom surface of the support sleeve 100. Gas seals can be formed between the first and second surfaces and between the third and the fourth surfaces.

Figure 3:
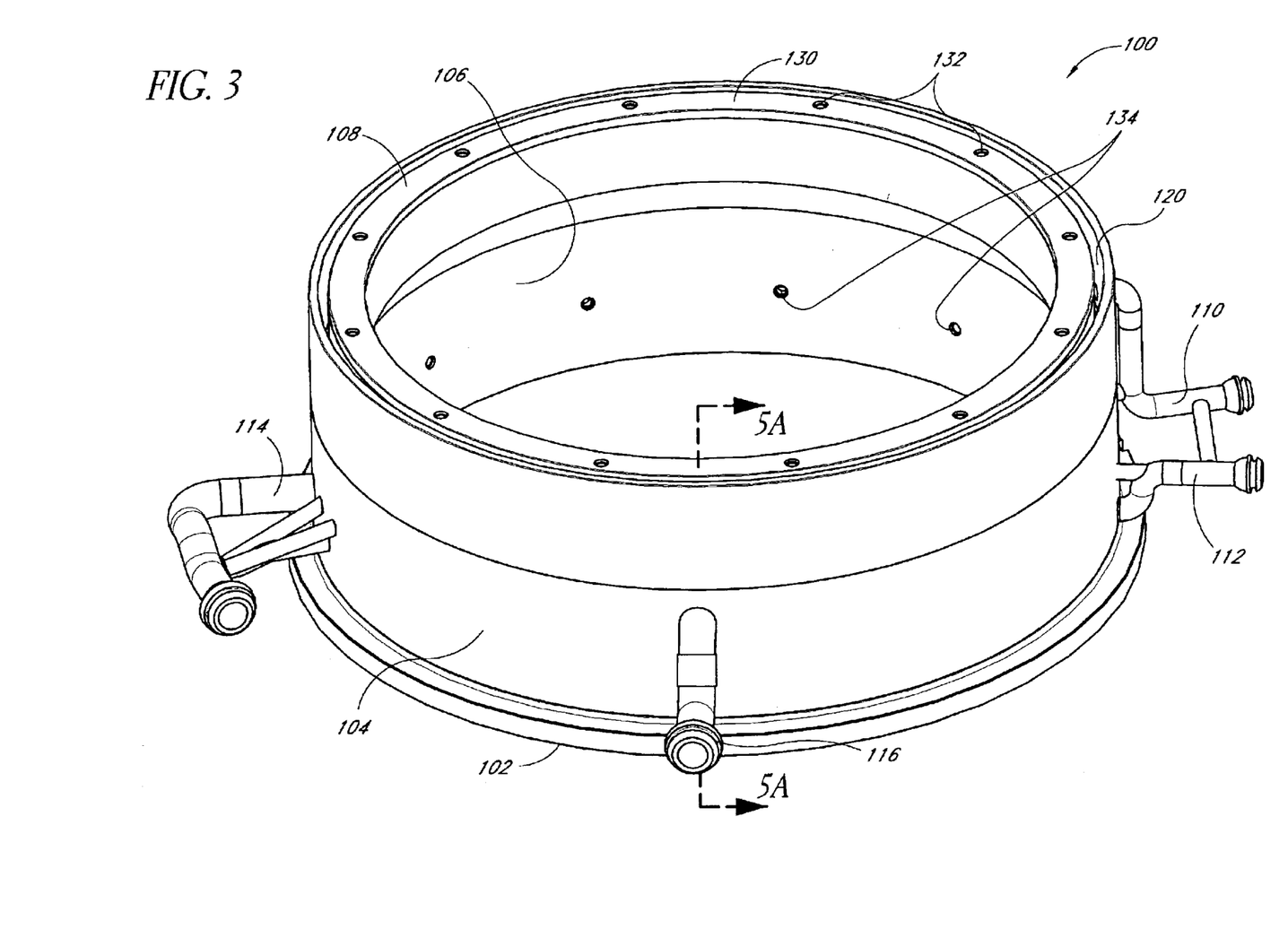
FIG. 3 is a perspective view of the support sleeve of FIGS. 1 and 2.
Figure 4:
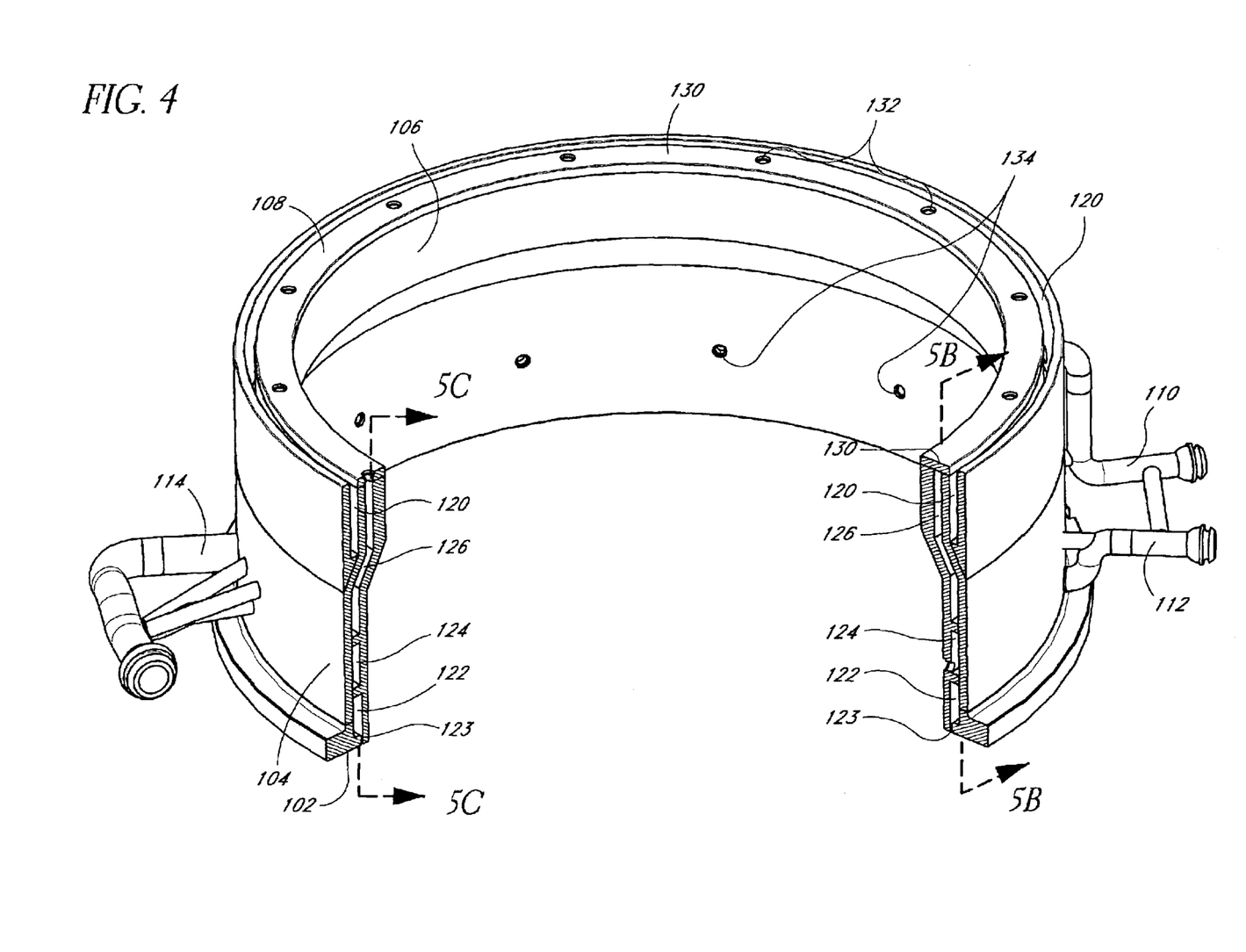
FIG. 4 is a partial cutaway view of the support sleeve of FIG. 3.

FIGS. 3 and 4 are perspective views showing the support sleeve 100 in greater detail, with FIG. 4 being a partial cutaway view of the support sleeve 100 shown in FIG. 3. The support sleeve 100 is illustrated with a bottom surface 102, an outer surface 104, an inner surface 106 and a top surface 108. With reference to FIG. 4, the illustrated, exemplary embodiment is provided with four circumferential channels:

an upper sealing circumferential channel 120, for providing a seal with the overlying process tube 10 (FIG. 1);

a lower sealing circumferential channel 122, for providing a seal with an underlying surface, e.g., a removable closure such as the surface 18 (FIG. 2) of the pedestal 60;

a gas distribution circumferential channel 124; and a gas exhaust circumferential channel 126.

The upper sealing circumferential channel 120 is open at the top surface 108 of the support sleeve 100. Preferably, the channel 120 is completely open at the top surface 108, such that the opening extends continuously along the perimeter of the top surface 108. The upper sealing circumferential channel 120 is connected to a gas communication line, represented by the tube 110, which can be used for feeding pressurized gas into the upper sealing circumferential channel 120 or to evacuate gas from the upper sealing circumferential channel 120. It will be appreciated that in a case where pressurized gas is fed into the upper sealing circumferential channel 120, the tube 110 is connected to a source of pressurized gas (not shown) and where gas is evacuated from the upper sealing circumferential channel 120, the tube 110 is connected to a vacuum generator (not shown), e.g., a vacuum pump.

The lower sealing circumferential channel 122 is provided with a slit 123, shown continuously open along the entire length of the channel 122, the opening open to the lower surface 102 of the support sleeve 100. The lower sealing circumferential channel 122 is connected to a gas communication line, represented by the tube 112, that can be used for feeding pressurized inert gas to the lower sealing circumferential channel 122 or to evacuate gas from the lower sealing circumferential channel 122. As discussed above, it will be appreciated that in a case where pressurized gas is fed to the lower sealing circumferential channel 122, the tube 112 is connected to a source of pressurized gas (not shown) and where gas is evacuated from the lower sealing circumferential channel 122, the tube 112 is connected to a vacuum generator (not shown), e.g., a vacuum pump.

The gas distribution circumferential channel 124 is provided with a plurality of gas injection holes 134, which, as illustrated, are preferably equally spaced and distributed in a spaced-apart relationship over the length of the gas distribution circumferential channel 124. The gas injection holes 134 open into a lower annular gap 17 (FIGS. 1 and 2). The gas distribution circumferential channel 124 is connected to a gas communication line, represented by the gas feed tube 114, which is further connected to one or more process gas sources (not shown).

The gas exhaust circumferential channel 126 is closed at the top by a ring 130, which is provided with a plurality of gas exhaust holes 132, which, as illustrated, are preferably equally spaced and distributed in a spaced-apart relationship over the circumference of the ring 130. The gas exhaust holes 132 open into the annular exhaust gap 13 (FIG. 1) to allow gas to exit the reaction space 15 (FIG. 1). As such, the gas exhaust circumferential channel 126 is connected to an exhaust tube 116.

Figure 5A:
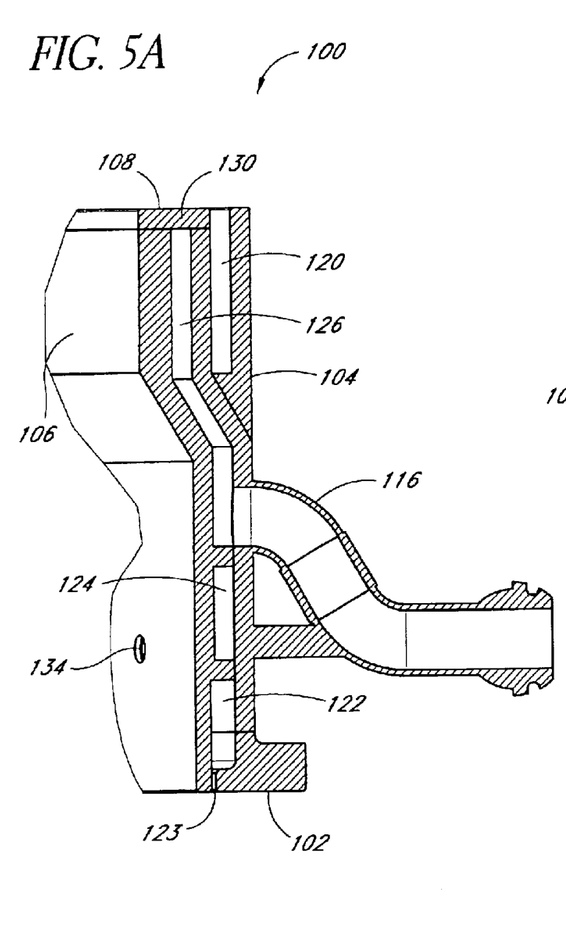
FIG. 5A is a cross-sectional side view of one section of the support sleeve of FIGS. 3 and 4, taken along the vertical plane 5A—5A of FIG. 3.
Figure 5B:
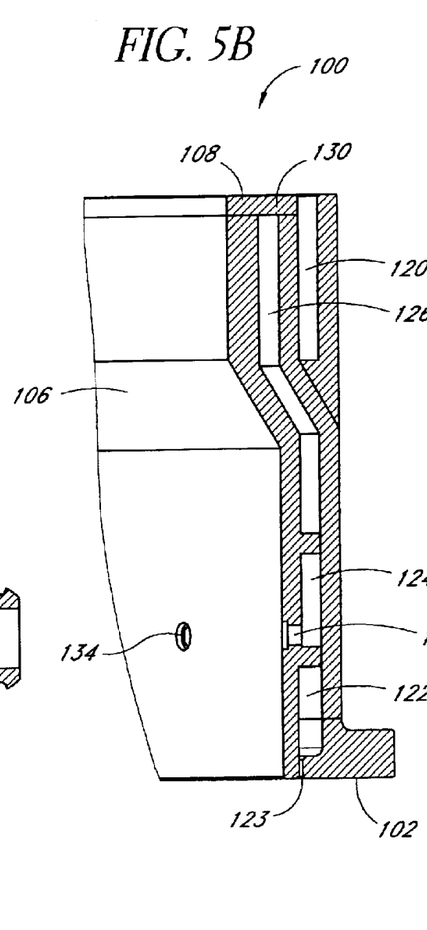
FIG. 5B is a cross-sectional side view of one section of the support sleeve of FIGS. 3 and 4, taken along the vertical plane 5B—5B of FIG. 4.
Figure 5C:
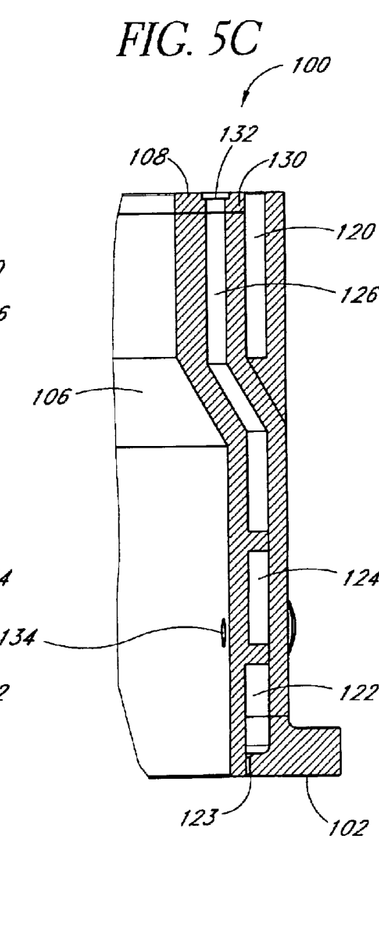
FIG. 5C is a cross-sectional side view of one section of the support sleeve of FIGS. 3 and 4, taken along the vertical plane 5C—5C of FIG. 4.

FIGS. 5A, 5B and 5C show side views of different cross sections of the support sleeve 100, taken at different locations. FIG. 5A shows a cross-section taken through the exhaust tube 116, along the vertical plane 5A—5A of FIG. 3. Notably, the exhaust tube 116 is shown connected to the gas exhaust circumferential channel 126 (see also FIG. 4).

FIG. 5B shows a cross-section taken at the location of one of the gas injection holes 134, along the vertical plane 5B—5B of FIG. 4. Notably, the gas injection hole 134 is shown providing an opening for the gas distribution circumferential channel 124 (see also FIG. 4).

FIG. 5C shows a cross section taken at the location of one of the gas exhaust holes 132, along the vertical plane 5C—5C of FIG. 4. Notably, the gas exhaust hole 132 is shown providing an opening for the gas distribution circumferential channel 126 (see also FIG. 4).

Semiconductor processing performed in accordance with preferred embodiments of the invention offers numerous advantages. For example, with reference to FIGS. 1 and 4, during semiconductor processing, the process tube 10 sits on the upper surface 108 of the support sleeve 100 so that the upper sealing circumferential channel 120 is completely closed off by the flange 11 of the process tube 10. The inner tube 12 also rests on the upper surface 108 and, more particularly, on the part of the top surface of the ring 130 that is closer to the center of the process tube. Process gas is injected into the reaction space 15 of the furnace 5 through the gas injection holes 134. Preferably, the gas injection holes 134 are substantially equally spaced apart and have a cross-sectional area which, relative to the cross-sectional area of the gas distribution circumferential channel, is small enough to allow the flow of gas through each of the gas injection holes 134 to be approximately equal, in which case a cylindrically symmetrical injection of process gas into the process tube, by way of the lower gap 17 between the support sleeve 100 and the pedestal 60, can be achieved. It will be appreciated that the reaction space 15 is defined by the inner tube 12 and is occupied by wafers (not shown) during processing.

With continuing reference to FIGS. 1 and 2, during passage of the injected gas through the gas distribution circumferential channel 124 (FIG. 4), and during passage of the gas in an upward direction in the lower gap 17 between the support sleeve 100 and the pedestal 60, an effective heat transfer occurs from the support sleeve 100 and the pedestal 60 to the gas because of the very large contact area over the gas flow path through the lower gap 17. It will be appreciated that the lower gap 17 is a subsection of the reaction space 15. Desirably, because of the cylindrically symmetrical flow pattern of the gas after injection, heat will be withdrawn from the pedestal 60 and the support sleeve 100 in a substantially cylindrically symmetrical way. Consequently, when the gas enters the reaction space 15 delimited by the inner tube 12, it will be effectively preheated without significantly disturbing the temperature symmetry in lower regions of the furnace 5. Then the gas contacts wafers stored in the wafer boat 80 and moves toward the top of the furnace 5. The gas is then symmetrically exhausted by flowing down the exhaust gap 13 between the inner tube 12 and the outer tube 10, then flowing through the gas exhaust holes 132 in the upper surface 108 of the support sleeve 100, the gas exhaust circumferential channel 126 (FIG. 4) and the exhaust tube 116 (FIG. 3). It will be appreciated that substantially equal spacing of the gas exhaust holes 132 and the cylindrically symmetrical upward flow pattern of the injected gas contributes to the symmetrical exhaust through the holes 132.

With reference to FIG. 2, in constructing the support sleeve 100, as shown in, e.g., FIGS. 2 and 4, the upper part 100a of the support sleeve 100 preferably has an inner diameter which is slightly smaller than the inner diameter of the inner tube 12, so that the inner tube 12 can adequately be supported while roughly concentrically aligned with the outer process vessel 10 and while also allowing for some tolerance in the diameters and the positioning of the inner tube 12 on top of the support sleeve 100. The lower part 100b of the support sleeve 100, however, need not have the same diameter as the upper part 100a. For example, as illustrated in FIGS. 1–5, the lower part 100b can have an enlarged diameter relative to the support sleeve 100's inner diameter at its top surface 108, so that a lower part of a pedestal, such as the lower part 60b of the illustrated pedestal 60, with enlarged diameter relative to an upper part of the pedestal, such as upper part 60a of the illustrated pedestal 60, can be accommodated. Thus, in the preferred embodiments, the inner diameter of the lower part 100b of the support sleeve 100 is sufficiently large such that the pedestal 60 can be accommodated, with a lower part 100b of the support sleeve 100 having a diameter equal to or larger than the inner diameter of the inner tube 12. Advantageously, in this way, heat transport by radiation along lines of direct sight from the hot region of the furnace 5 is prevented because the line of direct sight is broken.

It will be appreciated that the support sleeve 100, having circumferential channels such as the circumferential channels 120, 122, 124 and/or 126 according to preferred embodiments of the invention, is a complex structure that is expensive to manufacture. Consequently, the support sleeve is preferably made of quartz, which allows shaping by cold machining techniques and hot welding and deformation techniques. The quartz material is preferably an opaque quartz material and not a clear quartz material. With clear quartz, although thermal conductivity is relatively low, heat transport due to radiation traveling through the quartz can be substantial. With opaque quartz, however, heat transport by radiation is advantageously effectively prevented.

It will also be appreciated that making complex structures with quartz is easier and simpler than making such structures with a SiC material, such, as that typically used in making process tubes for high temperature processing. By concentrating the structural complexity of the sealing, gas feed and gas exhaust circumferential channels into the quartz support sleeve, the design of the SiC process tube remains simple: it is just a simple tube, closed at the top, having a flange at the bottom and having uniformly smooth sidewalls, i.e., sidewalls which do not have without any connection tubes or other protrusions. Further, because of the cylindrically symmetrical gas flow facilitated by a support sleeve according to the preferred embodiments, such as the illustrated support sleeve 100, the use of a complicated boat rotation mechanism to average out non-uniformities caused by non-cylindrically symmetrical process gas flows is desirably made unnecessary. Therefore, in addition to achieving better results than prior art support sleeves, providing a furnace with a support sleeve according to the preferred embodiments is a very cost-effective solution to problems associated with prior art furnaces.

It will be appreciated that, in practice, a means of alignment is also preferably provided so that the process tube 10, the inner tube 12 and the support sleeve 100 can be properly positioned relative to each other. These alignment means can be formed by centering cams (not shown) provided on the outer tube 10, the support sleeve 100 and/or the inner tube 12.

It will also be appreciated that although the preferred embodiments are described in the context of a high temperature furnace, wherein the process tube is made of SiC and the support sleeve of quartz, and wherein the preferred embodiments are particularly advantageous, the present teachings are not limited to this context. Consequently, while the design is an elegant one, resulting in a high degree of cylindrical symmetry, it can be expected that the advantages of a support sleeve according to the preferred embodiments can be exploited in other circumstances. For example, in other arrangements, it is possible to apply the preferred embodiments to circumstances wherein the temperatures are moderately high, so that quartz process tubes can be used.

Moreover, while the preferred embodiments have been described in the context of cylindrical process vessels or tubes, it will be appreciated that the process vessels need only have a hollow shape and be able to accommodate wafers for processing; the actual horizontal cross-sectional shape of the process vessel and, by extension, the horizontal cross-sectional shape of the support sleeve, is not limited by the present teachings. Preferably, however, the shape is a smooth curve, such as a circle, to facilitate cylindrical symmetry in process gas flow. In addition, while the support sleeve is illustrated directly contacting the process tube and/or removable closure, intervening structures between the support sleeve and/or removable closure are also contemplated.

Similarly, various other modifications, omissions and additions may be made to the methods and structures described above without departing from the scope of the invention. All such modifications and changes are intended to fall within the scope of the invention, as defined by the appended claims.

We claim:

1. A support sleeve for supporting a process vessel in a furnace for semiconductor processing, comprising:
    a wall defining the support sleeve;
    a top surface;
    a bottom surface; and
    at least one channel disposed in the wall, wherein surfaces of the wall define sides of the at least one channel, the at least one channel extending in a horizontal direction along the wall and connected to a gas communication line to permit gas to be fed into, or exhausted out of, the at least one channel.

2. The support sleeve of claim 1, wherein the at least one channel comprises a process vessel sealing channel disposed in an upper portion of the support sleeve, the process vessel sealing channel comprising a process vessel sealing channel opening open to the top surface, the process vessel sealing channel opening extending along a perimeter of the wall.

3. The support sleeve of claim 2, wherein the process vessel sealing channel opening is continuously open along the entire perimeter of the wall.

4. The support sleeve of claim 2, wherein the top surface sealing channel is connected to an inert gas feed.

5. The support sleeve of claim 2, wherein the top surface sealing channel is connected to an exhaust for causing a vacuum in the top surface sealing channel.

6. The support sleeve of claim 1, wherein the at least one channel comprises a bottom surface sealing channel disposed in lower portion of the support sleeve, the bottom surface sealing channel having a bottom surface sealing channel opening open to the bottom surface, the bottom surface sealing channel opening extending along a perimeter of the wall.

7. The support sleeve of claim 6, wherein the bottom surface sealing channel opening is continuously open along the entire perimeter of the wall.

8. The support sleeve of claim 6, wherein the at least one channel further comprises a process vessel sealing channel disposed in an upper portion of the support sleeve, the process vessel sealing channel having a process vessel sealing channel opening open to the top surface, the process vessel sealing opening extending an entire perimeter of the wall.

9. The support sleeve of claim 6, wherein the bottom surface sealing channel is connected to an inert gas feed.

10. The support sleeve of claim 6, wherein the bottom surface sealing channel is connected to an exhaust for causing a vacuum in the bottom surface sealing channel.

11. The support sleeve of claim 1, wherein the at least one channel comprises a gas exhaust channel, wherein the gas exhaust channel comprises a gas exhaust opening on the top surface.

12. The support sleeve of claim 11, wherein the gas exhaust opening comprises a plurality of circular holes, wherein the holes are equally spaced along a gas exhaust channel length.

13. The support sleeve of claim 1, wherein the at least one channel comprises a gas distribution channel, wherein the gas distribution channel comprises an opening to a volume partially delimited by the wall.

14. The support sleeve of claim 13, wherein the volume comprises a reaction space of the furnace.

15. The support sleeve of claim 13, wherein the gas distribution channel is connected to a gas feed for a process gas.

16. The support sleeve of claim 15, wherein the opening comprises a plurality of holes.

17. The support sleeve of claim 16, wherein the holes are substantially equally spaced apart and aligned on a horizontal plane.

18. The support sleeve of claim 17, wherein a flow of a process gas through a reaction space of the furnace is cylindrically symmetrical.

19. The support sleeve of claim 17, wherein a ratio of a first cross-sectional area of the opening to a second cross-sectional area of the gas distribution channel is chosen such that a flow rate of a gas passing through each hole is substantially equal.

20. The support sleeve of claim 1, wherein a horizontal cross-section of the support sleeve has a generally circular shape.

21. The support sleeve of claim 1, wherein the support sleeve comprises quartz.

22. The support sleeve of claim 1, wherein the support sleeve comprises opaque quartz.

23. A semiconductor processing furnace, comprising:

a process vessel support sleeve having a first surface, the first surface having a perimeter; and a process vessel overlying the support sleeve and supported by the first surface, the process vessel having a second surface, the second surface contacting the first surface, wherein the first surface comprises a first surface opening, the opening extending over a length of an interface between the first surface and the second surface, the interface extending over a length of the perimeter, wherein the first surface comprises a top surface of the support sleeve and the second surface comprises a bottom surface of the process tube.

24. The furnace of claim 23, wherein the first surface supports the process vessel and an inner tube, wherein the inner tube is concentrically aligned with and has an inner tube circumference smaller than a process vessel circumference.

25. The furnace of claim 24, wherein the top surface of the support sleeve has an inner circumference, wherein the inner circumference is smaller than the inner tube circumference.

26. The furnace of claim 24, wherein the furnace further comprises a gas exhaust channel, the gas exhaust channel comprising a plurality of holes on the first surface.

27. The furnace of claim 26, wherein the plurality of holes open into a volume between the process tube and the inner tube.

28. A semiconductor processing furnace, comprising:

a process vessel support sleeve having a first surface, the first surface having a perimeter; and a process vessel overlying the support sleeve and supported by the first surface, the process vessel having a second surface, the second surface contacting the first surface, wherein the first surface comprises a first surface opening, the opening extending over a length of an interface between the first surface and the second surface, the interface extending over a length of the perimeter, further comprising a closure that can be removed from the furnace, the closure underlying the support sleeve and having a third surface contacting the support sleeve at a fourth surface of the support sleeve, the fourth surface extending a perimeter of the support sleeve and having a fourth surface opening extending a fourth surface length.

29. The furnace of claim 28, wherein the third surface comprises a top surface of the closure and the fourth surface comprises a bottom surface of a support sleeve.

30. The furnace of claim 29, wherein the closure comprises a pedestal for supporting a wafer boat.

31. The furnace of claim 28, wherein the fourth surface opening is a slit.

32. The furnace of claim 28, wherein a seal is formed by supplying pressurized gas to the first surface opening.

33. The furnace of claim 32, wherein gas flows out of the first surface opening and between the first surface and the second surface.

34. The furnace of claim 32, wherein the pressurized gas is an inert gas.

35. The furnace of claim 34, wherein the inert gas comprises a nitrogen gas.

36. The furnace of claim 34, wherein the inert gas feed comprises an argon gas.

37. The furnace of claim 28, wherein a seal is formed by generating a vacuum in the first surface opening.

38. The furnace of claim 37, wherein gas flows into the first surface opening.

39. A method for forming a seal between parts of a semiconductor processing furnace, comprising:

circulating a gas inside a first sealing channel, the first sealing channel defined by surfaces of a wall and open to a first contact surface with a first contact part, the wall defining a support sleeve and partially separating a reaction space for processing wafers and an ambient atmosphere, the support sleeve supporting a process tube; and     generating a first pressure differential, wherein a first sealing channel gas pressure is either greater than both a reaction space gas pressure and an ambient atmosphere gas pressure or the sealing channel gas pressure is less than both the reaction space gas pressure and the ambient atmosphere gas pressure.

40. The method of claim 39, wherein the support sleeve further supports an inner tube, wherein the inner tube is concentrically aligned with and has an inner tube circumference smaller than a process tube circumference.

41. The method of claim 39, wherein generating a first pressure differential comprises expelling gas out of the sealing channel into the reaction space and the ambient atmosphere.

42. The method of claim 39, wherein the gas is an inert gas.

43. The method of claim 42, wherein the gas is nitrogen gas.

44. The method of claim 42, wherein the gas is argon gas.

45. The method of claim 39, wherein the first contact part is a lower surface of the process tube.

46. The method of claim 45, further comprising generating a second pressure differential, wherein a second sealing channel gas pressure is either greater than or less than both the reaction space gas pressure and the ambient atmosphere gas pressure, wherein the second sealing channel is defined by surfaces of the wall, the second sealing channel opening to a second contact surface with a closure that can be removed from the furnace, the closure underlying the support sleeve.

47. The method of claim 46, wherein the closure comprises a pedestal.

48. The method of claim 39, further comprising flowing a process gas around an interior of the wall and injecting the process gas into the reaction space.

49. The method of claim 48, further comprising removing the process gas from the reaction space by flowing the process gas through a plurality of openings in the first contact surface.

50. A method for manufacturing semiconductor devices, comprising:

flowing a gas around a circumference of a support sleeve, wherein flowing occurs inside a wall defining the support sleeve and wherein the support sleeve supports a process tube; and     expelling the gas out of a surface of the support sleeve, wherein expelling comprises injecting the gas out of a plurality of holes into a reaction space inside a semiconductor processing furnace.

51. The method of claim 50, comprising processing a wafer at a temperature higher than about 1100° C.

52. The method of claim 51, wherein the temperature is about 1350° C.

53. The method of claim 50, wherein the gas exits each hole of the plurality of holes at a substantially equal rate.

54. The method of claim 53, wherein the gas moves in a cylindrically symmetrical flow pattern after exiting the plurality of holes.

55. The method of claim 50, wherein the gas is removed from the reaction space through a plurality of openings on a top surface of the support sleeve.

56. The method of claim 50, further comprising feeding pressurized inert gas into a first sealing channel at a top surface of the support sleeve.

57. The method of claim 56, further comprising generating a vacuum in a second sealing channel at a bottom surface of the support sleeve.

58. The method of claim 56, further comprising feeding pressurized inert gas into a second sealing channel at a bottom surface of the support sleeve.

* * * * *